US007922545B2

(12) United States Patent
Saitoh

(10) Patent No.: US 7,922,545 B2
(45) Date of Patent: Apr. 12, 2011

(54) PRESS-FIT TERMINAL

(75) Inventor: Yasushi Saitoh, Mie (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/050,942

(22) Filed: Feb. 7, 2005

(65) Prior Publication Data

US 2005/0176267 A1 Aug. 11, 2005

(30) Foreign Application Priority Data

Feb. 10, 2004 (JP) ................................ P2004-033393

(51) Int. Cl.
*H01R 13/42* (2006.01)

(52) U.S. Cl. ........................................................ 439/751

(58) Field of Classification Search .................. 439/751, 439/887, 892

See application file for complete search history.

(56) References Cited

U.S. PATENT DOCUMENTS

| | | | | |
|---|---|---|---|---|
| 4,662,702 | A * | 5/1987 | Furuya | 439/630 |
| 4,681,392 | A * | 7/1987 | Terita | 439/751 |
| 4,737,114 | A * | 4/1988 | Yaegashi | 439/82 |
| 4,746,301 | A * | 5/1988 | Key | 439/82 |
| 4,867,710 | A * | 9/1989 | Harting et al. | 439/751 |
| 4,923,414 | A * | 5/1990 | Sitzler | 439/751 |
| 5,002,507 | A * | 3/1991 | Sitzler | 439/751 |
| 5,118,300 | A * | 6/1992 | Zarreii | 439/79 |
| 5,564,954 | A * | 10/1996 | Wurster | 439/751 |
| 5,849,424 | A * | 12/1998 | Sugawara et al. | 428/674 |
| 5,916,695 | A * | 6/1999 | Fister et al. | 428/647 |
| 5,944,563 | A * | 8/1999 | Nagafuji | 439/751 |
| 6,024,580 | A * | 2/2000 | Dangler et al. | 439/67 |
| 6,042,429 | A * | 3/2000 | Bianca et al. | 439/733.1 |
| 6,183,885 | B1 * | 2/2001 | Nakamura et al. | 428/647 |
| 6,685,484 | B2 * | 2/2004 | Keyser | 439/77 |
| 6,755,699 | B2 * | 6/2004 | Beers et al. | 439/884 |
| 6,770,383 | B2 | 8/2004 | Tanaka et al. | |
| 2003/0186597 | A1 * | 10/2003 | Suzuki et al. | 439/886 |

FOREIGN PATENT DOCUMENTS

| | | |
|---|---|---|
| DE | 197 47 756 C 2 | 5/1998 |
| DE | 102 51 507 A 1 | 6/2003 |
| EP | 1 352 993 A1 | 10/2003 |
| JP | A-08-069828 | 3/1996 |
| JP | A 2000-067943 | 3/2000 |
| JP | A 2001-148261 | 5/2001 |
| JP | A-2003-171790 | 6/2003 |
| JP | A-2003-293187 | 10/2003 |
| JP | A-09-320668 | 12/2007 |

* cited by examiner

*Primary Examiner* — T C Patel
*Assistant Examiner* — Vladimir Imas
(74) *Attorney, Agent, or Firm* — Oliff & Berridge, PLC

(57) ABSTRACT

A press-fit terminal is adapted to be press-fitted in an through-hole of board for electrically conducting with the press-fit terminal. The press-fit terminal includes a terminal-base portion and a board inserting portion at least partially plated with tin. A thickness of the plated tin is from 0.1 to 0.8 μm.

10 Claims, 4 Drawing Sheets

FIG. 4

| THICKNESS OF THE THIN DEPOSIT [μm] | STATE OF THE TIN DEPOSIT |
|---|---|
| 0 TO 0.1 | NOT FORMED |
| 0.1 TO 0.2 | NO SCRAPING |
| 0.2 TO 0.3 | NO SCRAPING |
| 0.3 TO 0.4 | NO SCRAPING |
| 0.4 TO 0.5 | NO SCRAPING |
| 0.5 TO 0.6 | NO SCRAPING |
| 0.6 TO 0.7 | NO SCRAPING |
| 0.7 TO 0.8 | NO SCRAPING |
| 0.8 TO 0.9 | SCRAPING |
| 0.9 TO 1.0 | SCRAPING |

PRESS-FIT TERMINAL

BACKGROUND OF THE INVENTION

1. Field of the Invention

The present invention relates to a press-fit terminal which is not subject to scraping of tin deposit.

2. Description of the Related Art

There has heretofore been a press-fit terminal which is devised in shape to prevent the exfoliation (scraping) of deposit from through-hole during insertion (see, e.g., JP-A-2001-148261).

There has also been proposed a press-fit terminal which is plated with tin on the portion thereof other than the portion to be press-fitted to reduce the fitting force (see; e.g., JP-A-2000-67943).

SUMMARY OF THE INVENTION

A press-fit terminal plated with tin has an excellent reliability in connection to the electrically-conductive through-hole in the board but is disadvantageous in that the tin deposit can be scraped during insertion in the through-hole to give scrapings that adversely affect surrounding circuits, etc.

It can thus been proposed that the press-fit terminal be plated with nickel, which is harder than tin, instead of tin. However, nickel plating is disadvantageous in that it is inferior to tin plating in reliability in connection.

The invention has been worked out to solve the aforementioned problems.

It is an object of the invention to provide a press-fit terminal which is devised in deposit thickness to inhibit scraping of tin deposit.

According to one aspect of the invention, there is provided with a press-fit terminal adapted to be press-fitted in an through-hole of board for electrically conducting with the press-fit terminal, including: a terminal-base portion; and a board inserting portion at least partially plated with tin, wherein a thickness of the plated tin is from 0.1 to 0.8 μm.

By thus configuration, the press-fit terminal is plated with tin to a thickness of from 0.1 to 0.8 μm at least at the portion thereof to be inserted in the board. In this arrangement, since the tin deposit is an extremely thin layer, the effect of the hardness of the matrix of the press-fit terminal (e.g., copper alloy) can be exerted to inhibit scraping of tin deposit during insertion in the through-hole.

According to another aspect of the invention, a portion to be plated with the tin is undercoat-plated with copper to a thickness of from 0.5 to 1 μm.

According to another aspect of the invention, a portion to be plated with the tin is undercoat-plated with nickel to a thickness of from 1 to 1.3 μm.

According to another aspect of the invention, the portion to be plated with the tin is interlayer-plated with the copper, and the portion to be plated with the tin is undercoat-plated with the nickel.

By thus configuration, the effect of the hardness of the undercoat deposit or interlayer deposit can be exerted to further inhibit scraping of tin deposit.

According to another aspect of the invention, a tin-copper diffusion layer is formed between the tin deposit and the copper deposit by heat treatment.

In this arrangement, the effect of the hardness of the diffusion layer can be exerted to further inhibit scraping of tin deposit.

BRIEF DESCRIPTION OF THE DRAWINGS

FIG. 4 shows a state of the tin deposit in its thickness from 0 to 1 μm according to one embodiment of the invention.

DESCRIPTION OF THE PREFERRED EMBODIMENTS

Embodiments of implementation of the invention will be described in detail in connection with the attached drawings.

Figures 1A, 1B, 1C, 1D:
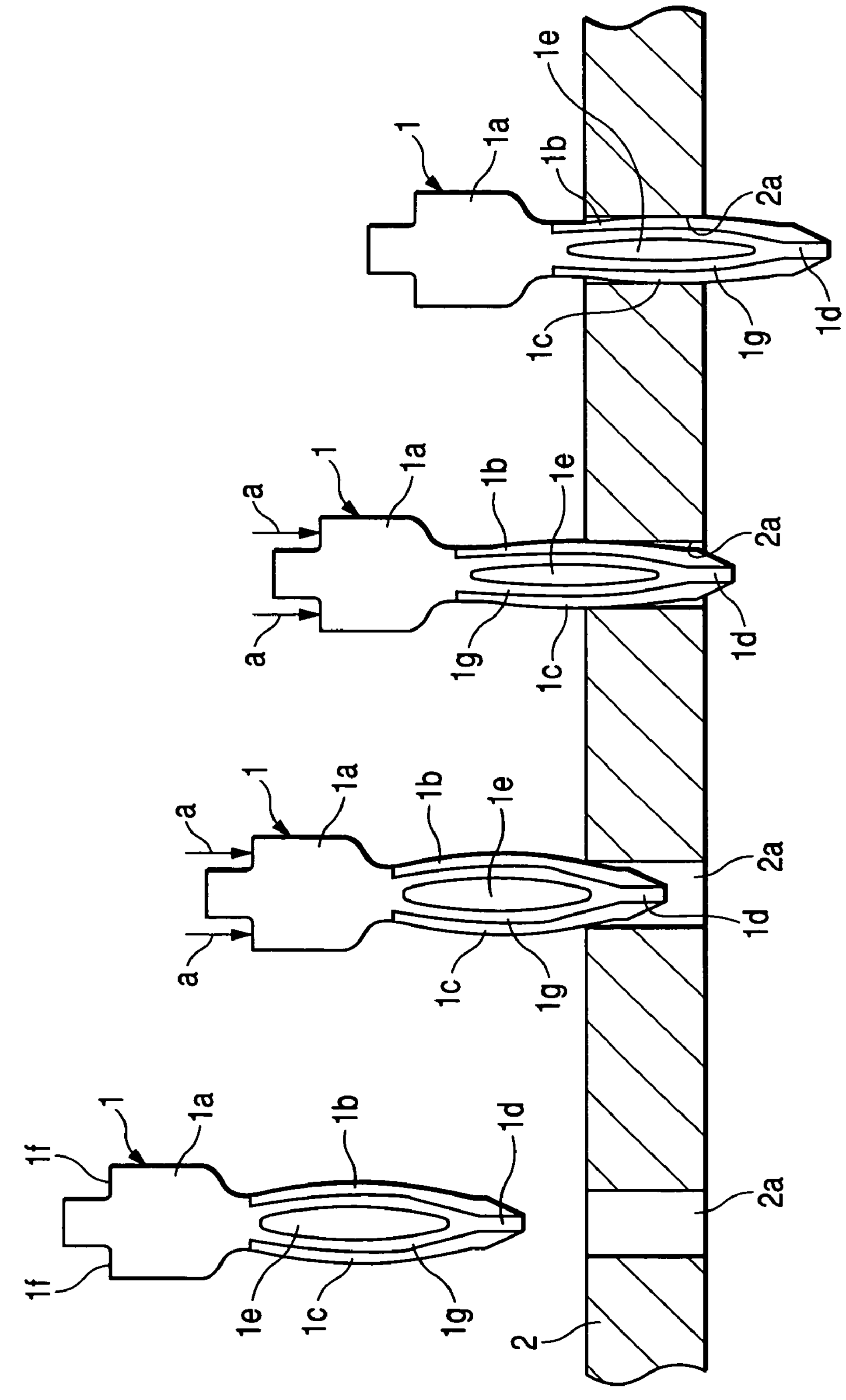
FIGS. 1A to 1D each are a front view illustrating the process of inserting a press-fit terminal according to one embodiment of the invention.

As shown in FIG. 1A, the press-fit terminal 1 has a terminal base portion 1*a* and a board inserting portion 1*b* provided therein. On the board inserting portion 1*b* are formed a forward end inserting portion 1*d* piercing a through-hole 2*a* in a board 2 and a contact inserting portion 1*c* contacting the through-hole 2*a*. A cavity-shaped slit portion 1*e* is formed extending between the contact inserting portion 1*c* and the forward end inserting portion 1*d*. The plating method is not limited to the press-fit terminal 1 having a shape exemplified in FIG. 1 but may be applied to press-fit terminals having various shapes.

At the both outer sides of the terminal base portion 1*a* of the press-fit terminal 1 are formed a shoulder 1*f* for tool pressing. In this arrangement, by depressing the both shoulders 1*f* by a tool at the same time as shown in FIGS. 1B and 1C (see the arrow a), the board inserting portion 1*b* is press-fitted in the electrically-conductive through-hole 2*a* in the board 2.

The through-hole 2*a* in the board 2 is plated with copper (Cu), though not shown.

Figure 2A:
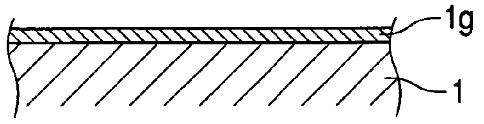
FIGS. 2A to 2E each are an enlarged sectional diagram of the plated portion of the press-fit terminal.

The press-fit terminal 1 is formed by a copper alloy and is plated with tin 1*g* at least at the board inserting portion 1*b* to a thickness of from 0.1 to 0.8 μm as shown in FIG. 2A. The tin deposit 1*g* may extend over the entire surface of the press-fit terminal 1 or may extend over the area of the board inserting portion 1*b* in contact with the through-hole 2*a*.

The board inserting portion 1*a* of the press-fit terminal 1 is thus plated with tin 1*g* to a thickness of from 0.1 to 0.8 μm. In this arrangement, since the tin deposit 1*g* is an extremely thin layer, the effect of the hardness of the matrix of the press-fit terminal 1 (e.g., copper alloy) can be exerted to inhibit scraping of tin deposit 1*g* during insertion in the through-hole 2*a*.

FIG. 4 shows a state of the tin deposit 1*g* in its thickness from 0 to 1 μm. As shown in FIG. 4, when the thickness of the tin deposit 1*g* falls 0.1 μm, the thickness of the tin deposit 1*g* is too small, making it more likely that the reliability in connection can be impaired. On the contrary, when the thickness of the tin deposit 1*g* exceeds 0.8 μm, the thickness of the tin deposit 1*g* is too great, making it more likely that the surface portion can be scraped. It is preferable that the thickness of the tin deposit 1*g* is from 0.3 to 0.5 μm.

Figure 2B:
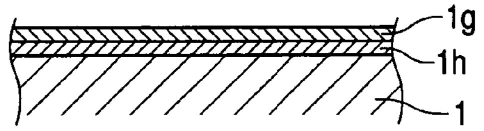
Figure 2C:
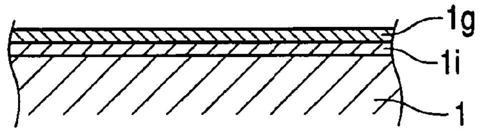
Figure 2D:
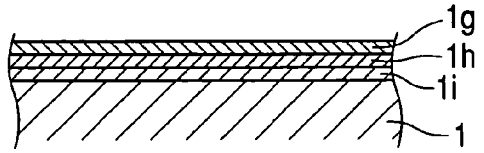

As shown in FIG. 2B, the portion of the press-fit terminal 1 to be plated with tin 1*g* may be undercoat-plated with copper 1*h* to a thickness of from 0.5 to 1 μm. Alternatively, as shown in FIG. 2C, the portion of the press-fit terminal 1 to be plated with tin 1*g* may be undercoat-plated with nickel (Ni) 1*i* to a thickness of from 1 to 1.3 μm. Alternatively, as shown in FIG. 2D, the portion of the press-fit terminal 1 to be plated with tin 1*g* may be interlayer-plated with copper 1*h* to a thickness of from 0.5 to 1 μm and undercoat-plated with nickel (Ni) 1*i* to a thickness of from 1 to 1.3 μm. The nickel deposit has the highest hardness. The copper deposit has the second highest hardness. The tin deposit has the lowest hardness.

By thus undercoat-plating the press-fit terminal 1 with copper 1*h* or the like, the effect of hardness of undercoat deposit or interlayer deposit can be exerted to further inhibit scraping of tin deposit 1*g*.

Figure 2E:
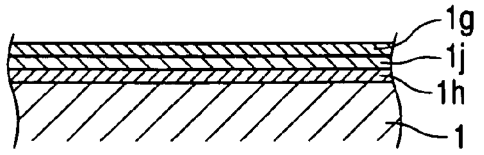

As shown in FIG. 2E, a tin-copper diffusion layer 1*j* may be formed between the tin deposit 1*g* and the copper deposit 1*h* in FIGS. 2B and 2D by heat treatment. Referring to the heat treatment, if the heat treatment is effected at a temperature of from 150° C. to 170° C., copper can easily diffuse into the tin deposit to convert the tin deposit layer 1*g* to Cu6Sn5 diffusion layer 1*j* beginning with the site in the vicinity of the interface with the copper deposit layer 1*h*, accelerating alloying.

By thus forming the diffusion layer 1*j*, the effect of hardness of the diffusion layer 1*j* can be exerted to further inhibit scraping of tin deposit 1*g*.

Figure 3:
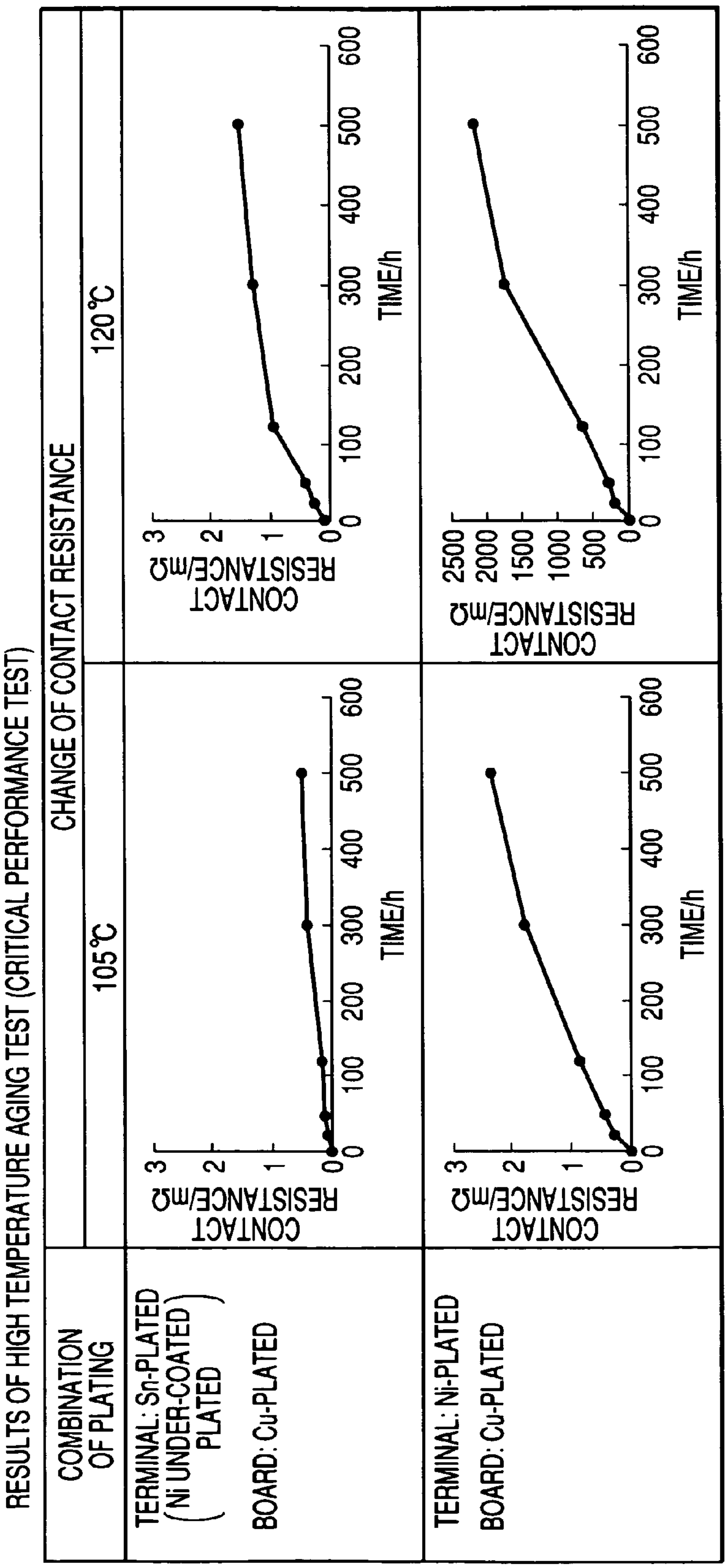
FIG. 3 is a graph illustrating the results of high temperature aging test on a product according to one embodiment of the invention and a related art product.

FIG. 3 is a graph illustrating the results of high temperature aging test. The upper case of this graph depicts the results of test on a press-fit terminal 1 according to one embodiment of the invention which is undercoat-plated with nickel (Ni) 1*i* at the portion there to be plated with tin 1*g*. The lower case of this graph depicts the results of test on a related art press-fit terminal which is merely plated with nickel (Ni). The through-hole 2*a* of the board 2 is merely plated with copper (Cu).

The two press-fit terminal samples were each allowed to stand at 105° C. and 120° C. for 500 hours. The temperature of 105° C. is a value proposed on the assumption that it is used in the cabin if it is used in automobile. The temperature of 120° C. is a value proposed on the assumption that it is used in the engine room, etc.

The product of one embodiment of the invention shown in the upper case of the graph exhibited a stabilized contact resistance even after 300 hours of aging at 105° C. The product of the one embodiment invention also exhibited a slight rise of contact resistance at 120° C. as compared with at 105° C. However, it is made clear that the product of one embodiment of the invention shows a small rise of contact resistance at any of the two temperatures. These results show that the product of one embodiment of the invention can be used as a press-fit terminal for connector in not only automobile cabin but also engine room, etc.

On the contrary, the related art product shown in the lower case of the graph tends to show an unstable change of contact resistance at any of the two temperatures of 105° C. and 120° C. It is made clear that the related art product shows a sudden rise of contact resistance by thousand time particularly at 120° C. These results show that the related art product can be difficultly used as a press-fit terminal for connector in automobile engine room, etc. unless some measure is taken to raise the contact load.

What is claimed is:

1. A press-fit terminal adapted to be press-fitted in a through-hole of a board for electrically conducting with the press-fit terminal, comprising:

a terminal-base portion; and a board inserting portion extending from the terminal-base portion, the board inserting portion at least partially plated with tin, the board inserting portion defining an elliptical-shaped opening, the board inserting portion including a proximal end closest to the terminal-base portion and a distal end farther from the terminal-base portion, wherein a thickness of the plated tin is from 0.1 to 0.8 μm to inhibit scraping of the tin on the board inserting portion, and a portion to be plated with the tin is undercoat-plated with nickel to a thickness of from 1 to 1.3 μm, wherein the elliptical-shaped opening is substantially symmetrical in a top and bottom direction, the elliptical-shaped opening extends completely through the board inserting portion, a width of the opening at the distal and proximal ends is less than a width of the opening between the distal and proximal ends, the width of the elliptical-shaped opening at the distal and proximal ends defining a curved base portion of the elliptical-shaped opening.

2. A press-fit terminal adapted to be press-fitted in a through-hole of a board for electrically conducting with the press-fit terminal, comprising:

a terminal-base portion; and a board inserting portion extending from the terminal-base portion, the board inserting portion at least partially plated with tin, the board inserting portion defining an elliptical-shaped opening, the board inserting portion including a proximal end closest to the terminal-base portion and a distal end farther from the terminal-base portion, wherein the thickness of the plated tin is from 0.1 to 0.8 μm to inhibit scraping of the tin on the board inserting portion, the portion to be plated with tin is plated with copper and nickel, the portion to be plated with the tin is interlayer-plated with the copper, the portion to be plated with the tin is undercoat-plated with the nickel, a thickness of the copper-plated interlayer is from 0.5 to 1 μm, and a thickness of the nickel-plated underlayer is from 1 to 1.3 μm, wherein the elliptical-shaped opening is substantially symmetrical in a top and bottom direction, the elliptical-shaped opening extends completely through the board inserting portion, a width of the elliptical-shaped opening at the distal and proximal ends is less than a width of the elliptical-shaped opening between the distal and proximal ends, the width of the elliptical-shaped opening at the distal and proximal ends defining a curved base portion of the elliptical-shaped opening.

3. The press-fit terminal according to claim 2, wherein a tin-copper diffusion layer is formed between the tin-plated layer and nickel-plated layer by heat treatment.

4. The press-fit terminal according to claim 1, wherein a portion to be plated with tin is plated with copper and nickel.

5. The press-fit terminal according to claim 4, wherein the portion to be plated with the tin is interlayer-plated with the copper, and the portion to be plated with the tin is undercoat-plated with the nickel.

6. The press-fit terminal according to claim 5, wherein a thickness of the copper-plated interlayer is from 0.5 to 1 μm, and a thickness of the nickel-plated underlayer is from 1 to 1.3 μm.

7. The press-fit terminal according to claim 1, wherein the thickness of the plated tin is from 0.3 to 0.5 μm.

8. The press-fit terminal according to claim 1, wherein the thickness of the plated tin is sufficiently thin to inhibit scraping during insertion into the through-hole that may adversely effect surrounding circuits on the board.

9. The press-fit terminal according to claim 1, wherein the board inserting portion defining a slit.

10. The press-fit terminal according to claim 1, wherein the board inserting portion defining a hole.

* * * * *